(12) United States Patent
Shu et al.

(10) Patent No.: US 8,488,408 B1
(45) Date of Patent: Jul. 16, 2013

(54) SYSTEMS AND METHODS INCLUDING CLOCK FEATURES SUCH AS MINIMIZATION OF SIMULTANEOUS SWITCHING OUTPUTS (SSO) EFFECTS INVOLVING ECHO CLOCKS

(75) Inventors: Lee-Lean Shu, Los Altos, CA (US);
Tuan Duc Nguyen, Milpitas, CA (US);
William Le, Milpitas, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 263 days.

(21) Appl. No.: 13/186,773

(22) Filed: Jul. 20, 2011

(51) Int. Cl.
*G11C 8/00* (2006.01)

(52) U.S. Cl.
USPC ............ 365/233.11; 365/189.05; 365/194; 365/233.13; 327/158; 327/160; 327/161

(58) Field of Classification Search
USPC ............ 365/189.05, 189.14, 189.19, 194, 365/230.06, 233.1, 233.11, 233.12, 233.13, 365/233.18; 327/158, 159, 160, 161
See application file for complete search history.

(56) References Cited

U.S. PATENT DOCUMENTS

| | | | |
|---|---|---|---|
| 5,920,511 A * | 7/1999 | Lee et al. ............. | 365/185.21 |
| 6,240,024 B1 * | 5/2001 | Taufique et al. ....... | 365/189.05 |
| 6,278,637 B1 | 8/2001 | Kawaguchi | |
| 6,353,575 B2 | 3/2002 | Lee | |
| 6,459,652 B1 | 10/2002 | Lee | |
| 6,583,659 B1 | 6/2003 | Kwong et al. | |
| 7,135,899 B1 | 11/2006 | Sancheti et al. | |
| 7,282,795 B2 | 10/2007 | Batey | |
| 7,411,439 B2 | 8/2008 | Brox et al. | |
| 7,876,617 B2 | 1/2011 | Chun | |
| 7,885,135 B2 | 2/2011 | Lee et al. | |
| 7,915,937 B2 | 3/2011 | Cook | |
| 2002/0008554 A1 | 1/2002 | Kim et al. | |
| 2002/0015352 A1 | 2/2002 | Lee | |
| 2005/0281074 A1 | 12/2005 | Han | |
| 2008/0068914 A1 | 3/2008 | Jeong | |

OTHER PUBLICATIONS

GSI Technology Datasheet, Sigma Quad B4 GS8662D36B, http://www.gsitechnology.com/8662DxxB.pdf, Rev. May 2011, 34 pages.
GSI Technology Datasheet, Sigma Quad B2 GS8662Q36B, http://www.gsitechnology.com/8662QxxB.pdf, Rev. May 2011, 35 pages.
GSI Technology Datasheet, SigmaSIO DDR GS8662S36B, http://www.gsitechnology.com/8662SxxB.pdf, Rev. May 2011, 36 pages.
GSI Technology Datasheet, Sigma DDR GS8662R36B, http://www.gsitechnology.com/8662RxxB.pdf, Rev. May 2011, 36 pages.
GSI Technology Datasheet, Sigma DDR GS8662T36B, http://www.gsitechnology.com/8662TxxB.pdf, Rev. May 2011, 36 pages.

(Continued)

*Primary Examiner* — Son Dinh
*Assistant Examiner* — Hien Nguyen
(74) *Attorney, Agent, or Firm* — DLA Piper LLP (US)

(57) ABSTRACT

Systems and methods are disclosed relating to semiconductor memory devices. According to some exemplary implementations, there are provided innovations associated with power and ground pads in devices such as static random access memory ("SRAM") devices and dynamic random access memory ("DRAM") devices. Moreover, the systems and/or methods may include features such as minimization of simultaneous switching outputs (SSO) effects relating to echo clock circuitry.

20 Claims, 14 Drawing Sheets

OTHER PUBLICATIONS

GSI Technology Datasheet, Low Latency DRAM GS4576S18, http://www.gsitechnology.com/4576S0918.pdf, Rev. Oct. 2011, 64 pages.

GSI Technology Datasheet, Low Latency DRAM GS4576C18, http://www.gsitechnology.com/4576C091836.pdf, Rev. Oct. 2011, 63 pages.

* cited by examiner

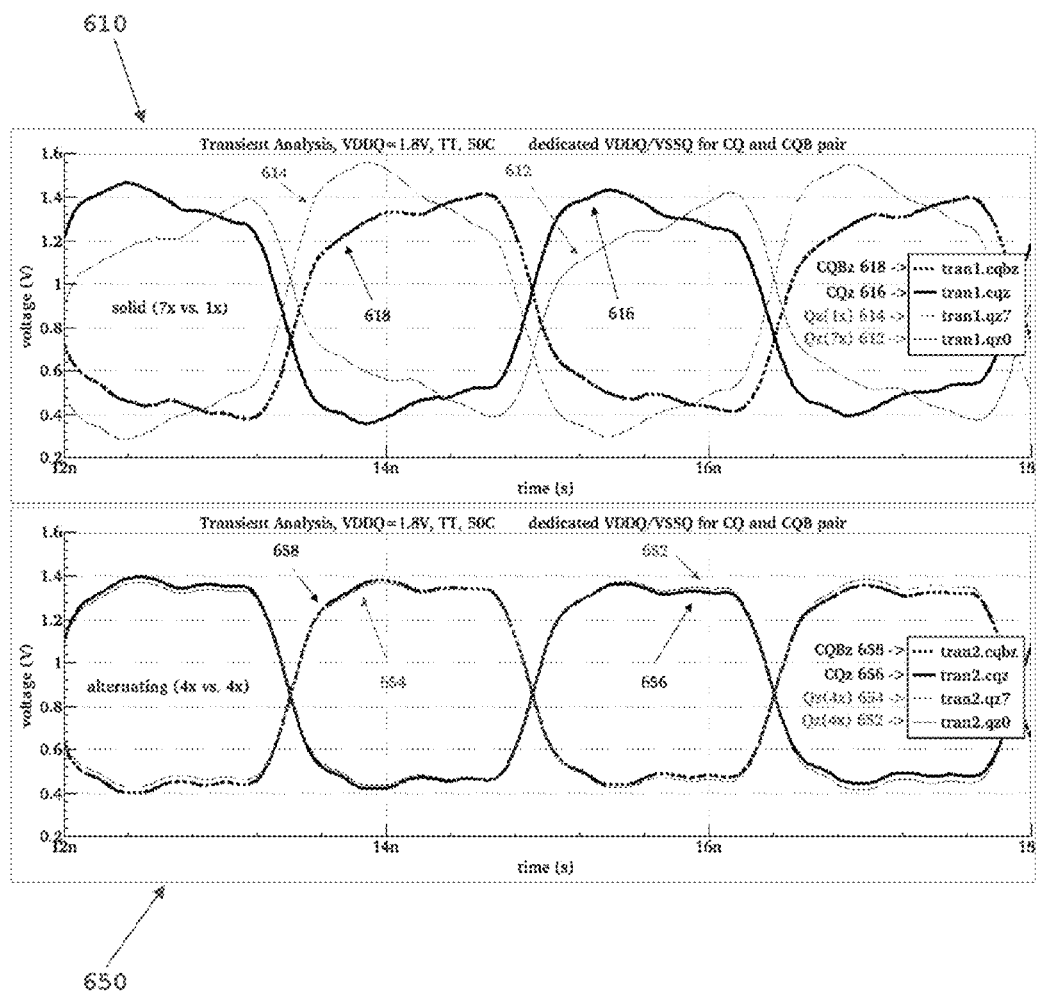
FIGURE 6: (present invention - from block diagram of figure 3) VDDQ/VSSQ is shared for both CQ and CQB only.

FIGURE 7: (present invention - from block diagram of figure 2) separating VDDQ/VSSQ for CQ; separating VDDQ/VSSQ for CQB.
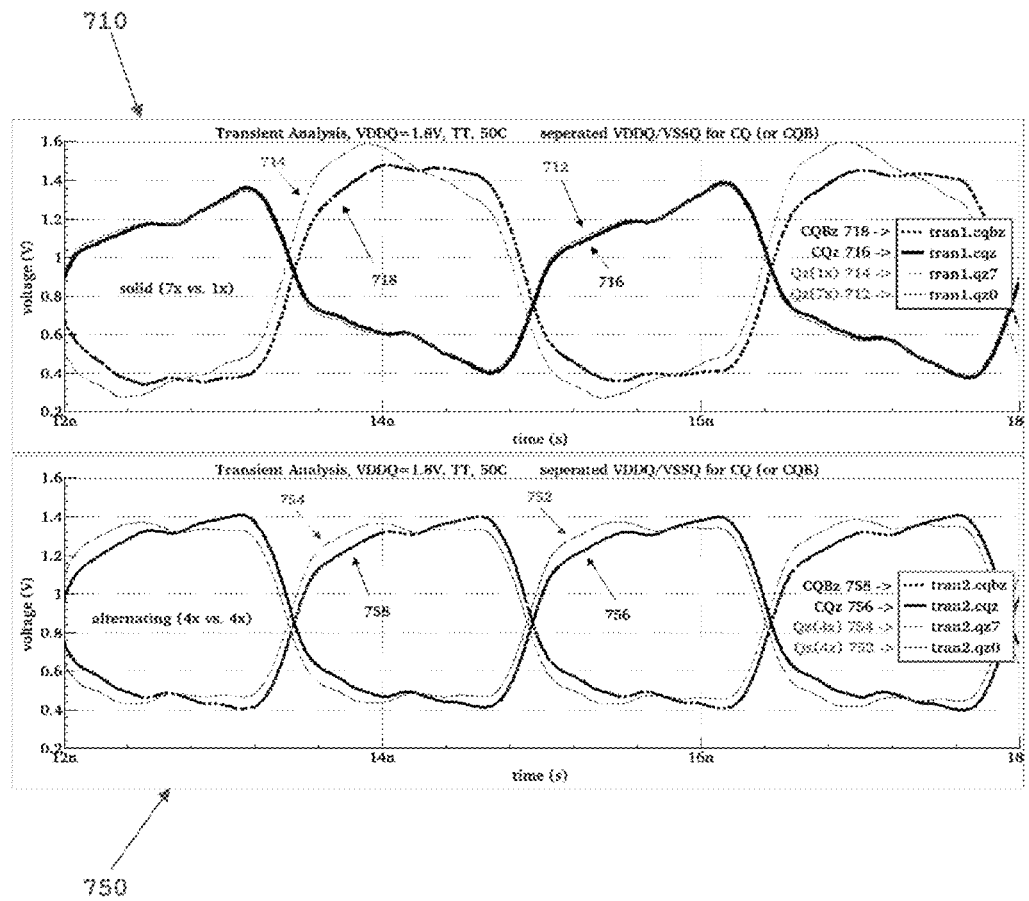

FIGURE 8: (from block diagram of figure 1) share VDDQ/VSSQ between CQ, CQB and data output (Q);
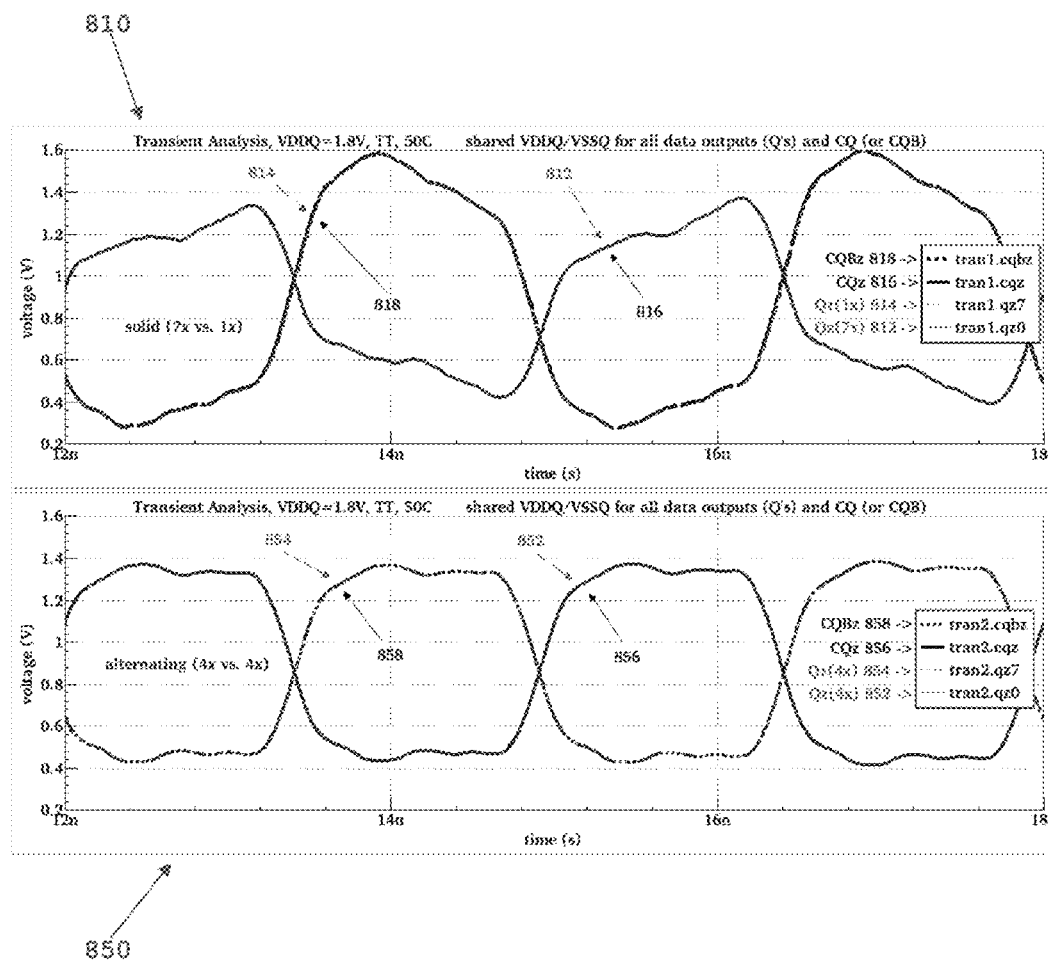

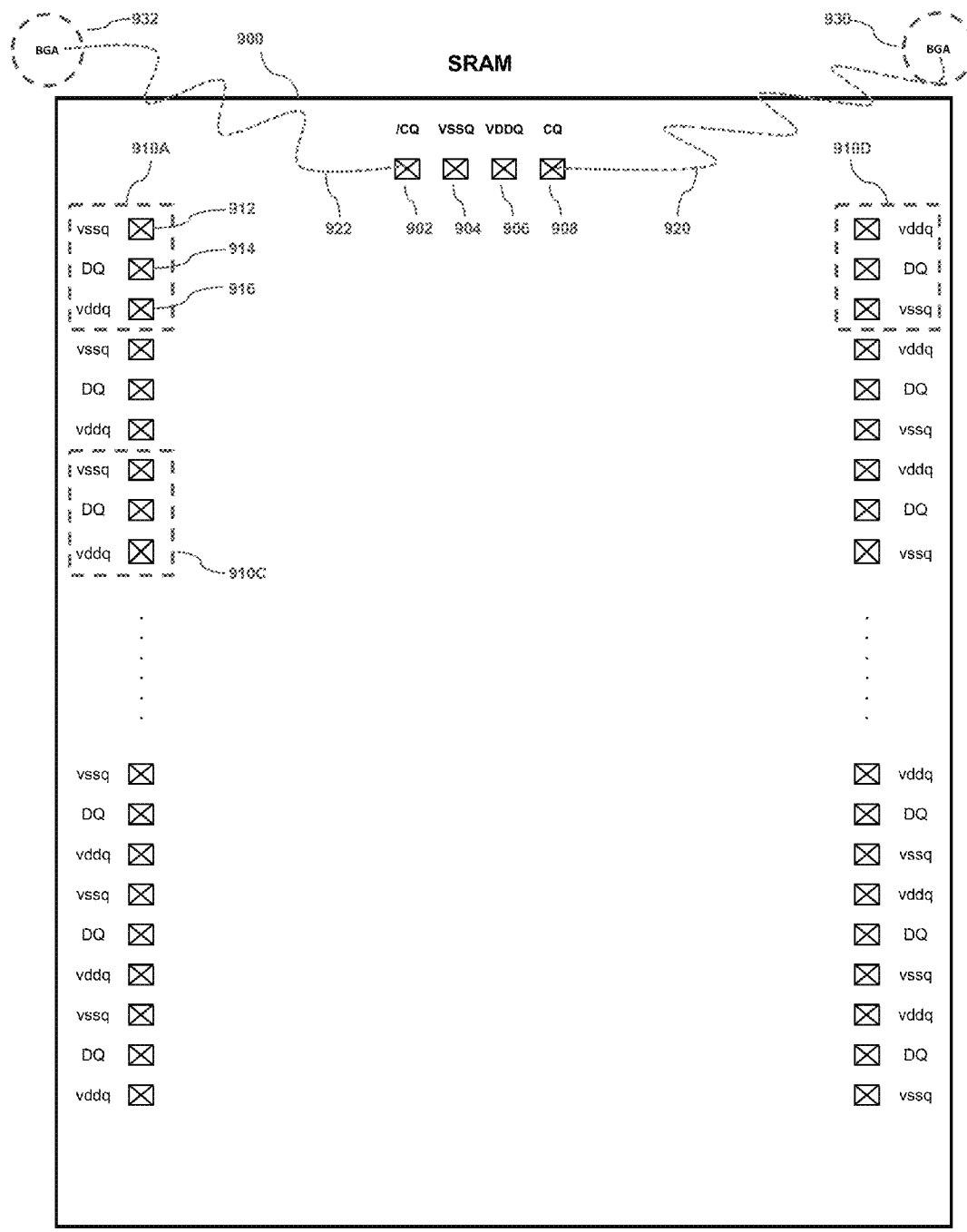
FIGURE 9: Echo clock (CQ and CQB), data output (Q's) and their power/gnd pads (for SRAM) in physical database

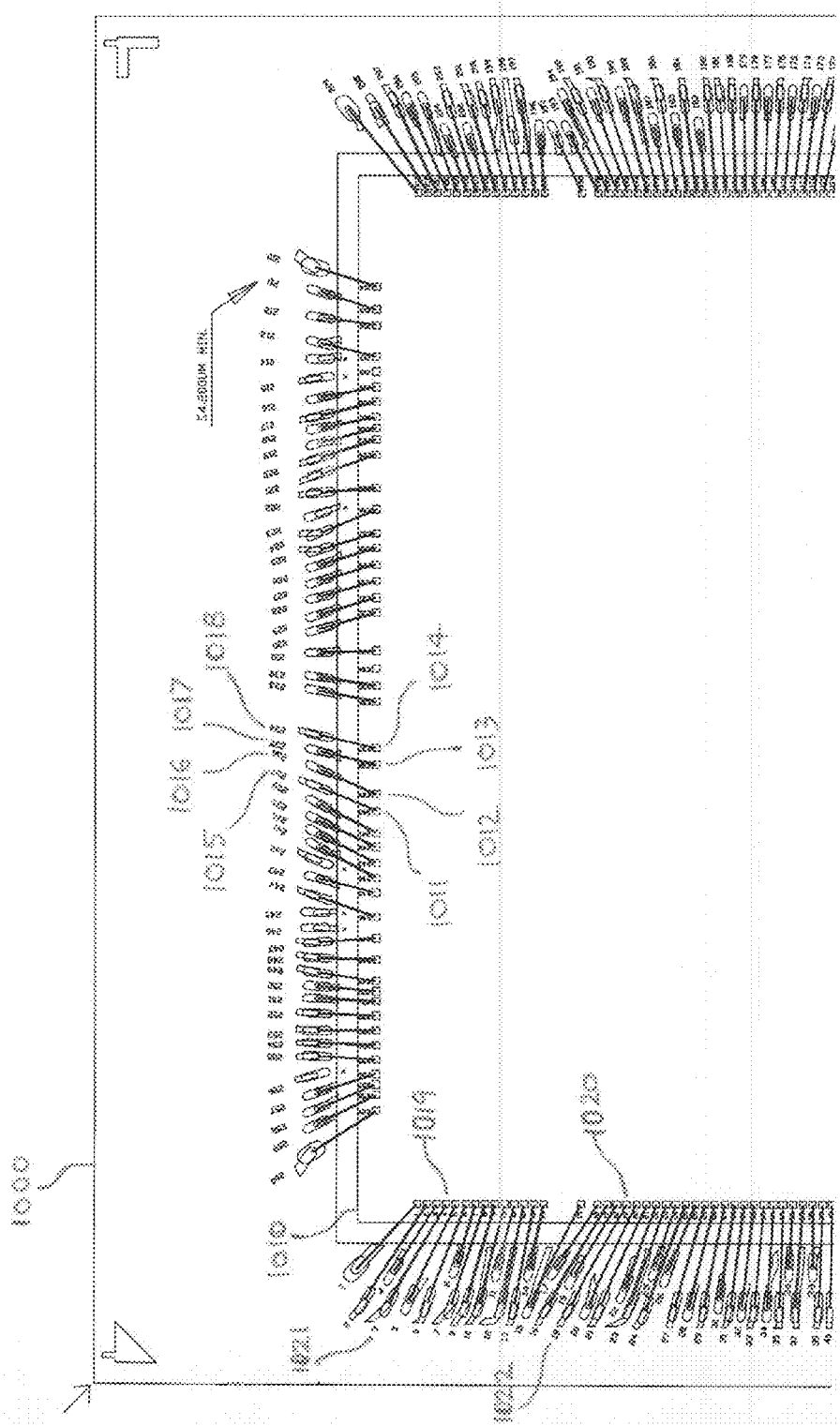

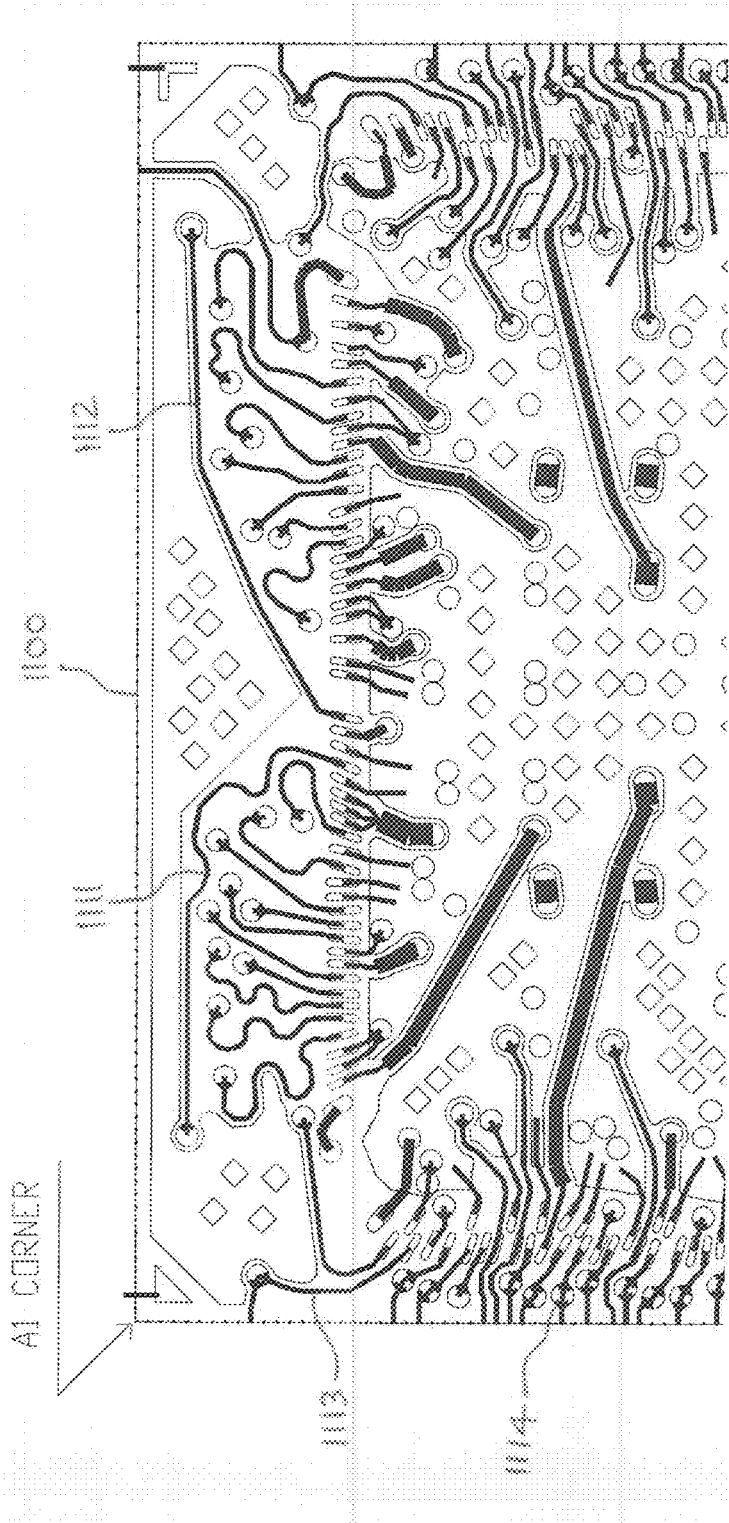

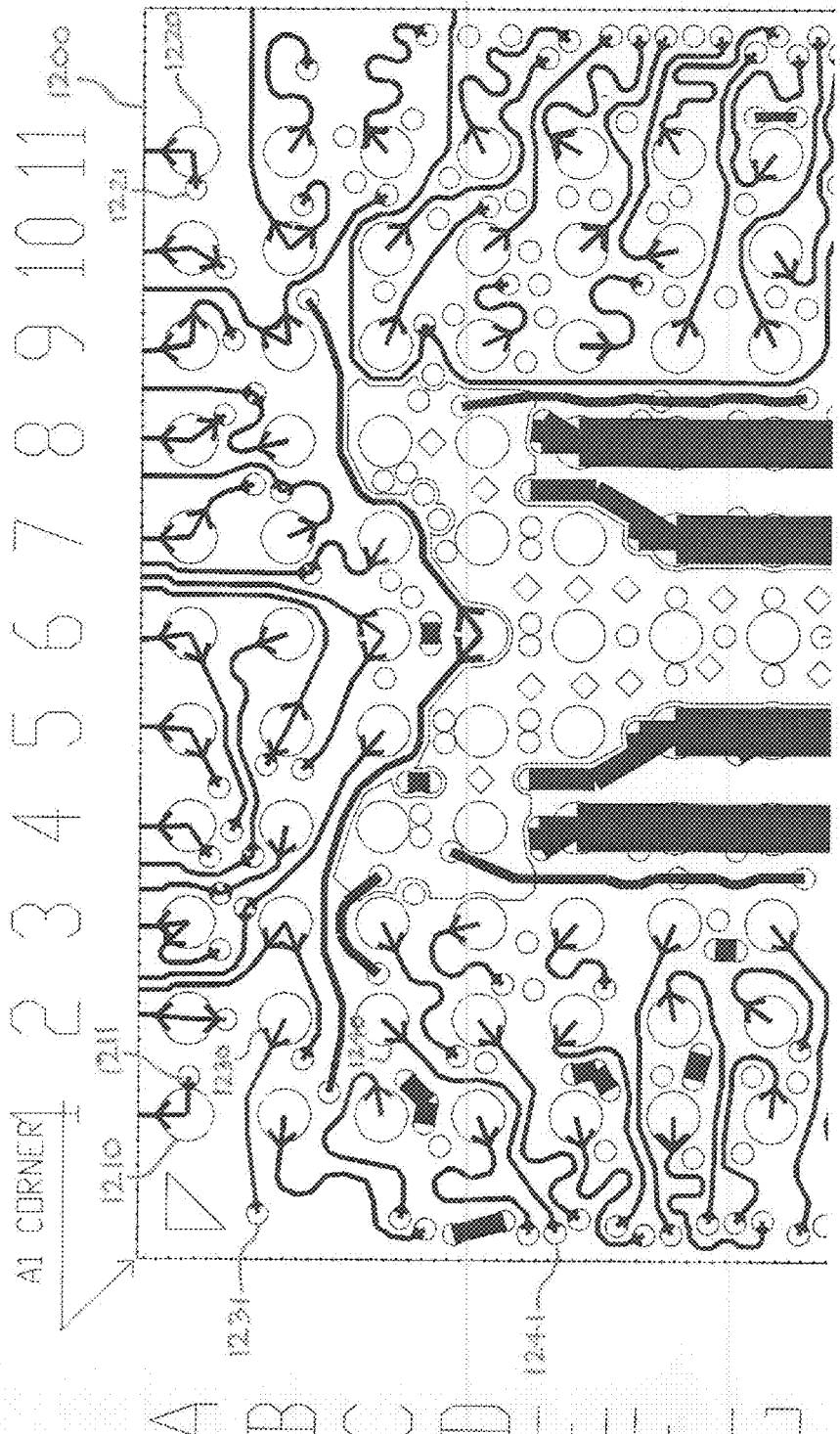
FIGURE 12: CU4 LAYER.

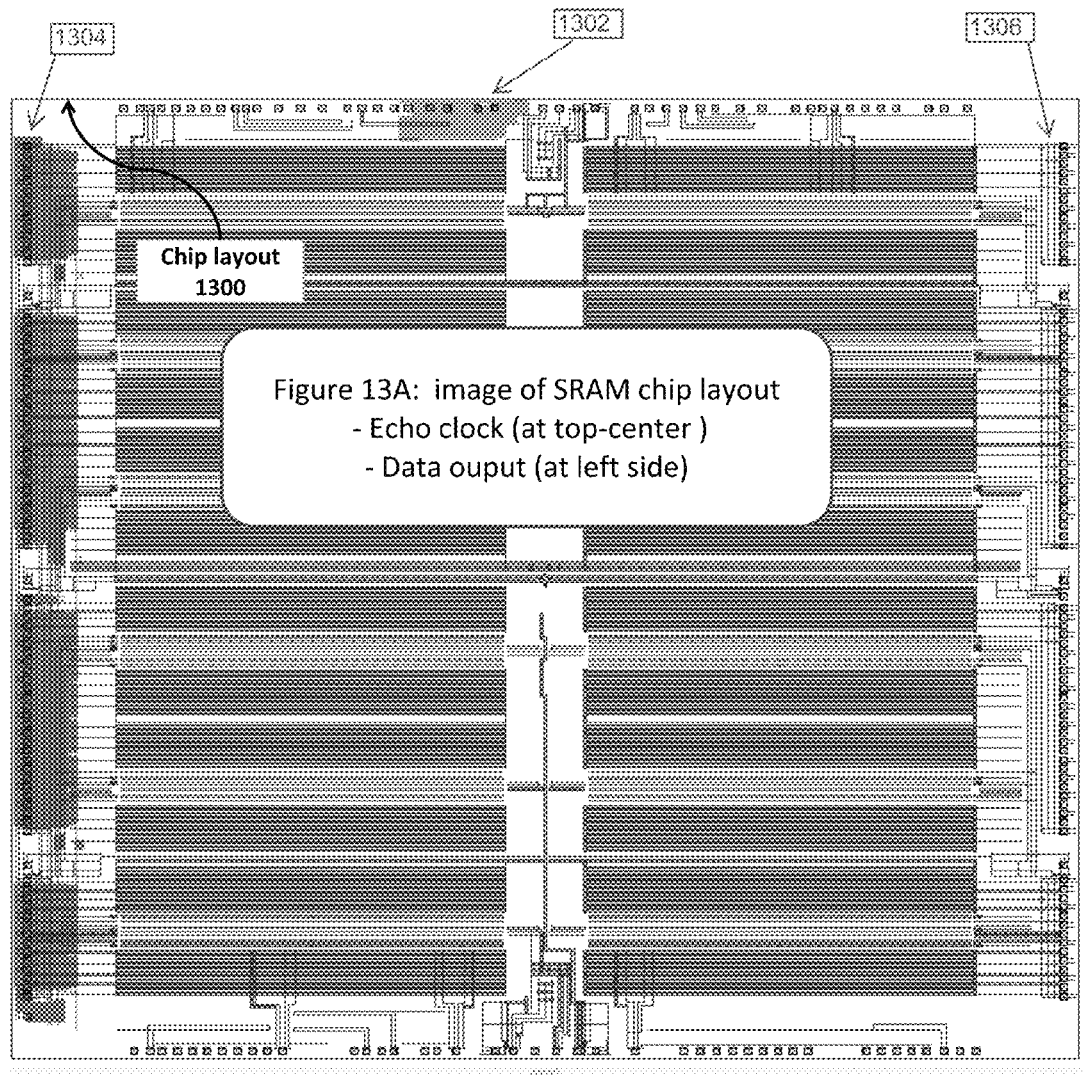

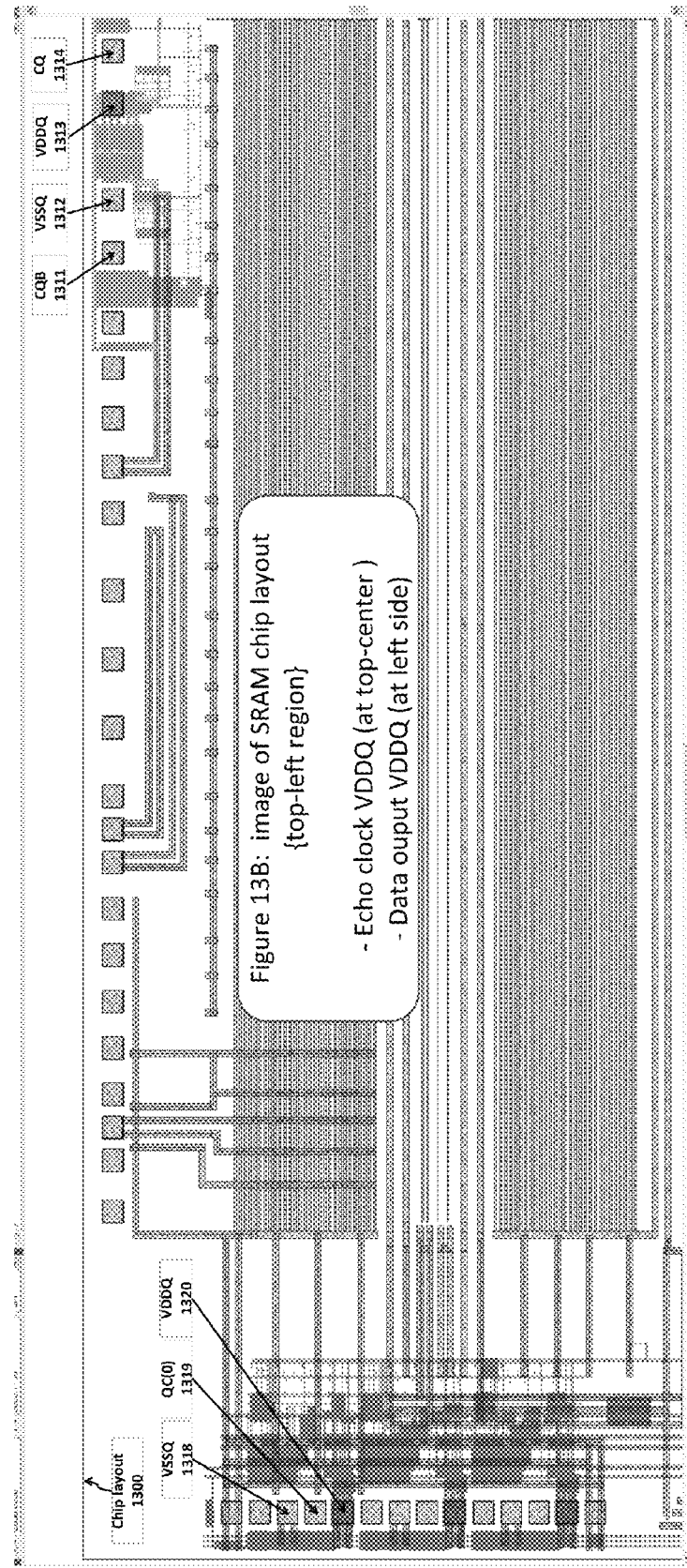

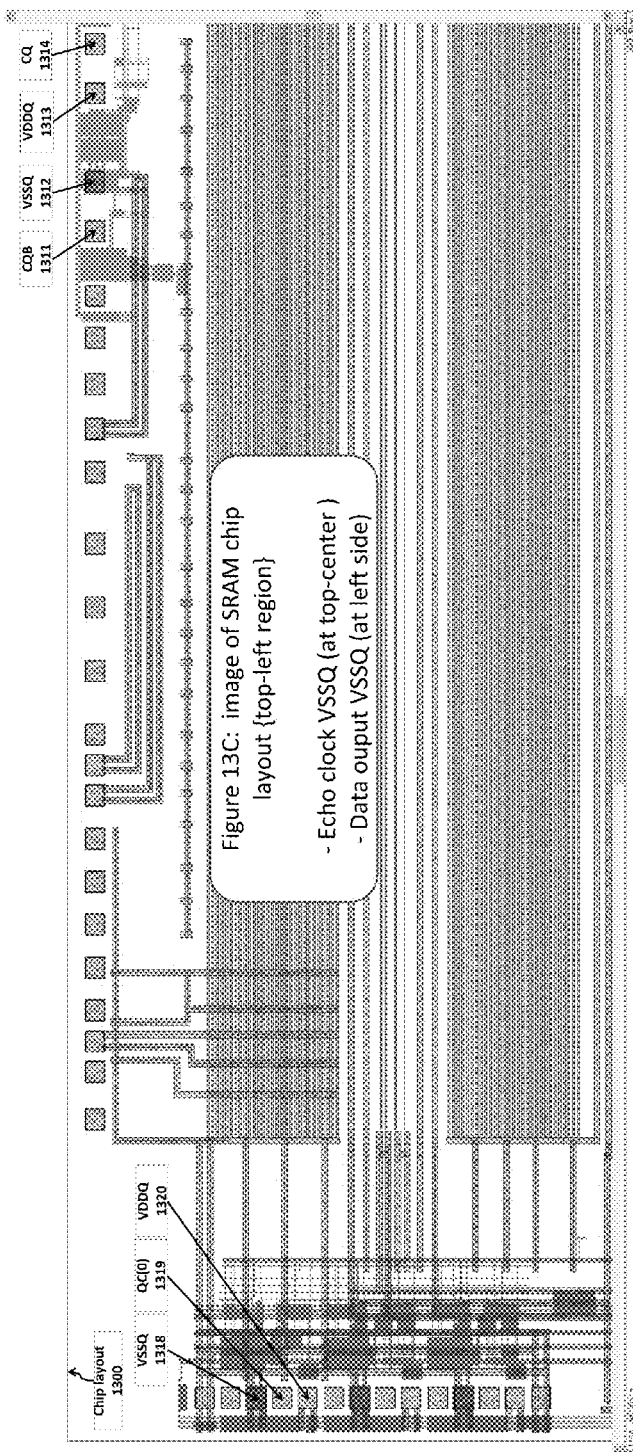

SYSTEMS AND METHODS INCLUDING CLOCK FEATURES SUCH AS MINIMIZATION OF SIMULTANEOUS SWITCHING OUTPUTS (SSO) EFFECTS INVOLVING ECHO CLOCKS

BACKGROUND

1. Field

The present innovations relate generally to semiconductor memory devices, and, more particularly, to systems and methods associated with power and ground pads in devices such as static random access memory ("SRAM") devices and dynamic random access memory ("DRAM") devices.

2. Related Information

As used herein, echo clocks refer to output clocks driven from a relevant device, such as a SRAM or DRAM. Echo clocks may register in a similar fashion as output data, such as being fired from the same internal signal of related data output registers. However, when output echo clock pairs (CQ and CQB) and data output (Q's) share power and ground pads, associated current and/or current rates (di/dt) such as those charged via associated inductors may introduce power and ground noise to the circuits, for example, during data output (Q) switching. This noise from power and ground can lead to misalignment of differential output echo clock pair (CQ and CQB) and to degradation of the echo clock signal integrity. Overall, such power and ground noise may adversely affect the output echo clock pair.

Responsive to these and other drawbacks of existing memory devices, there is a need for systems and methods that reduce such power and ground noise issues and/or provide circuits with desired differential output echo clock function(s), among other things.

DRAWINGS

The accompanying drawings, which constitute a part of this specification, illustrate various implementations and aspects of the present invention and, together with the description, explain the principles of the invention. In the drawings:

FIG. 6 illustrates exemplary waveforms showing reference clock and echo clock regarding FIG. 3 for different conditions (top vs. bottom) consistent with certain aspects related to the innovations herein.

FIG. 7 illustrates exemplary waveforms showing the reference clock and echo clock regarding FIG. 2 for different conditions (top vs. bottom) consistent with certain aspects related to the innovations herein.

FIG. 8 illustrates further exemplary waveforms showing the reference clock and echo clock regarding FIG. 1 for different conditions (top vs. bottom).

FIG. 9 is a block diagram of an exemplary device having pads as may be located on a chip consistent with certain aspects related to the innovations herein.

FIG. 10 depicts an exemplary bonding diagram design associated with an illustrative SRAM circuit consistent with certain aspects related to the innovations herein.

FIG. 11 depicts an exemplary upper metal layer substrate design associated with an illustrative SRAM circuit consistent with certain aspects related to the innovations herein.

FIG. 12 depicts an exemplary lower metal layer substrate design associated with an illustrative SRAM circuit consistent with certain aspects related to the innovations herein.

FIGS. 13A, 13B and 13C are illustrations of chip layout designs of exemplary SRAM chips and circuitry consistent with certain aspects related to the innovations herein.

DETAILED DESCRIPTION OF EXEMPLARY IMPLEMENTATIONS

Reference will now be made in detail to the invention, examples of which are illustrated in the accompanying drawings. The implementations set forth in the following description do not represent all implementations consistent with the claimed invention. Instead, they are merely some examples consistent with certain aspects related to the invention. Wherever possible, the same reference numbers will be used throughout the drawings to refer to the same or like parts.

Many systems, devices and chips rely on supplemental clock signals to enable performance in synch with a reference clock. Examples of such devices are static random access memory ("SRAM") devices and dynamic random access memory ("DRAM") devices. Aspects of the present inventions relate to these SRAM and DRAM devices including, inter alia, sigma quad, sigma DDR and Low Latency DRAM (LLDRAM) devices. Among other things, systems and methods consistent with the present innovations may include or involve aspects related to dedicated power and ground pads for output echo clock pairs(s) and/or decoupling capacitance for power and ground, among other features. Here, for example, such separate or disparate power and/or ground pads for the output echo clock pair (CQ and CQB) may minimize or prevent power and ground noise coming from output switching that affects the output echo clock pair (CQ and CQB). Via inclusion of this and/or other features, systems and methods herein may improve the echo clock signal integrity, among other things.

As explained herein, output echo clock pairs (CQ and CQB) and data outputs (Q's) may have dedicated power and ground pads. Further, SRAMs and DRAMs herein may otherwise reduce current and/or current rates (di/dt) including those related to any associated inductor(s) that introduce power and ground noise into the circuitry, such as during data output (Q) switching. As set forth in more detail below, aspects of the innovations herein may minimize adverse effects of such power and ground noise on the output echo clock pairs (CQ and CQB).

Figure 1:
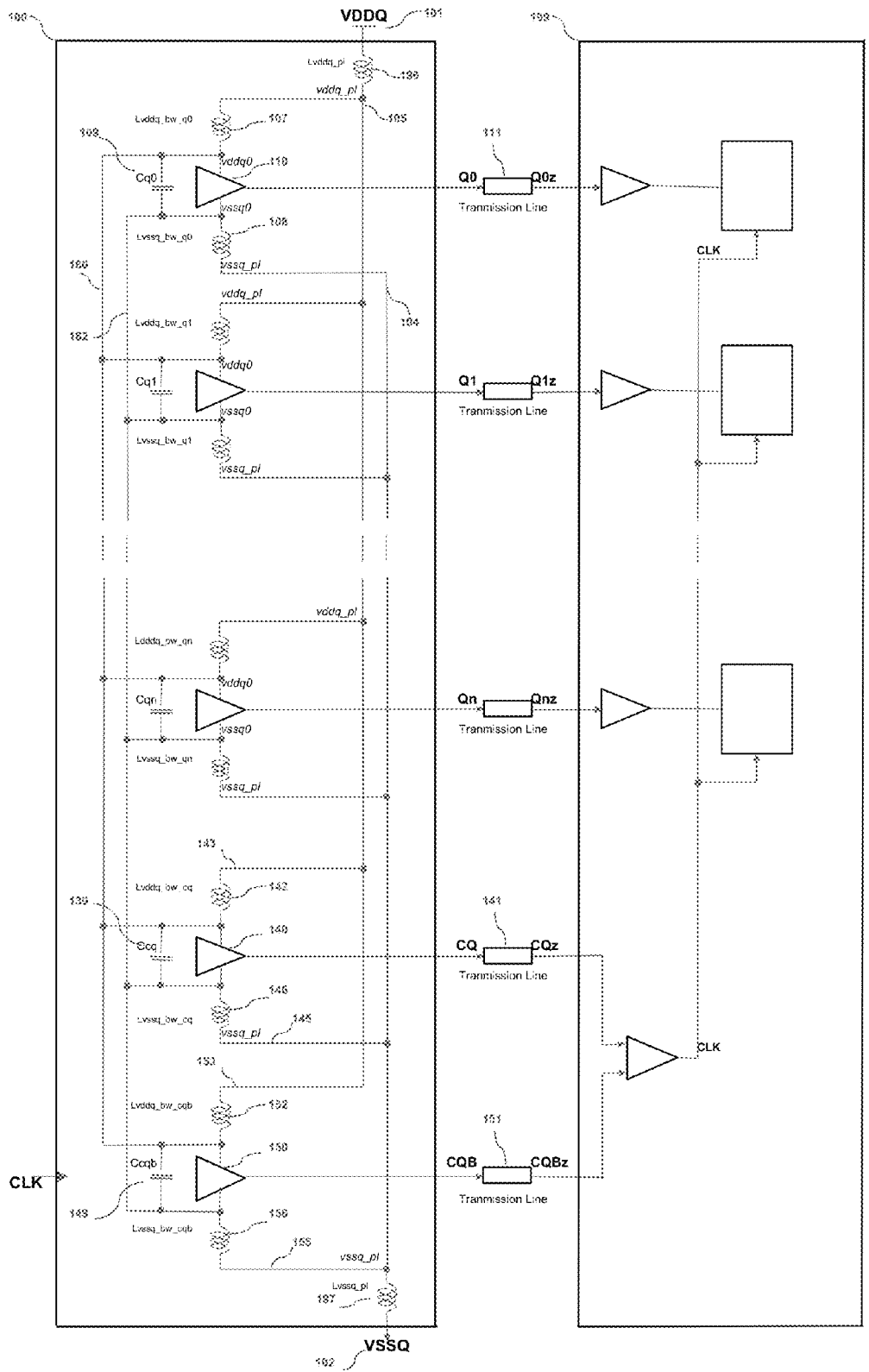
FIG. 1 is a block diagram of an exemplary device illustrating various data output and echo clock pads.

FIG. 1 is a block diagram of an exemplary device illustrating various data output and echo clock pads. Referring to FIG. 1, an illustrative diagram of dedicated power and ground pads for the echo clocks is shown, wherein each echo clock, CQ 140 and CQB 150, has its own power pads and ground pads, the echo clock power pads share a power bus with the data output (Q) power pads, and the echo ground pads share a ground bus with the data output (Q) ground pads. FIG. 1 illustrates a chip 100, such as an SRAM or DRAM, that drives another chip 199 via transmission lines such as representative lines 111, ..., 141 and 151. In the illustrative chip 100 shown, the VDDQ 101 and VSSQ 102 planes of the package may all share all VDDQ_PL 105 and VSSQ_PL 104 of the SRAM (or DRAM) chip through VDDQ power plane inductor Lvddq_pl 196 and VSSQ power plane inductor Lvssq_pl 197, respectively. With regard to output, each data output (Q0 110, Q1, . . . , Qn) may have its own VDDQ pad, VSSQ pad, power inductor (Lvddq_bw_q0 107, Lvddq_bw_q1, Lvddq_bw_qn), ground inductor (Lvssq_bw_q0 108, Lvssq_bw_q1, Lvssq_bw_qn) and decoupling capacitor (Cq0 109, Cq1, Cqn). Further, each echo clock (CQ 140, CQB 150) may have its own VDDQ pad, VSSQ pad, power inductor (Lvddq_bw_cq 142 and Lvddq_bw_cqb 152), ground inductor (Lvssq_bw_cq 146 and Lvssq_bw_cqb 156) and decoupling capacitor (Ccq 139 and Ccqb 149), respectively. Additionally, all power pads of data output (Q0 110, Q1, Qn) and echo clock outputs (CQ 140 and CQB 150) may be connected together.

Figure 2:
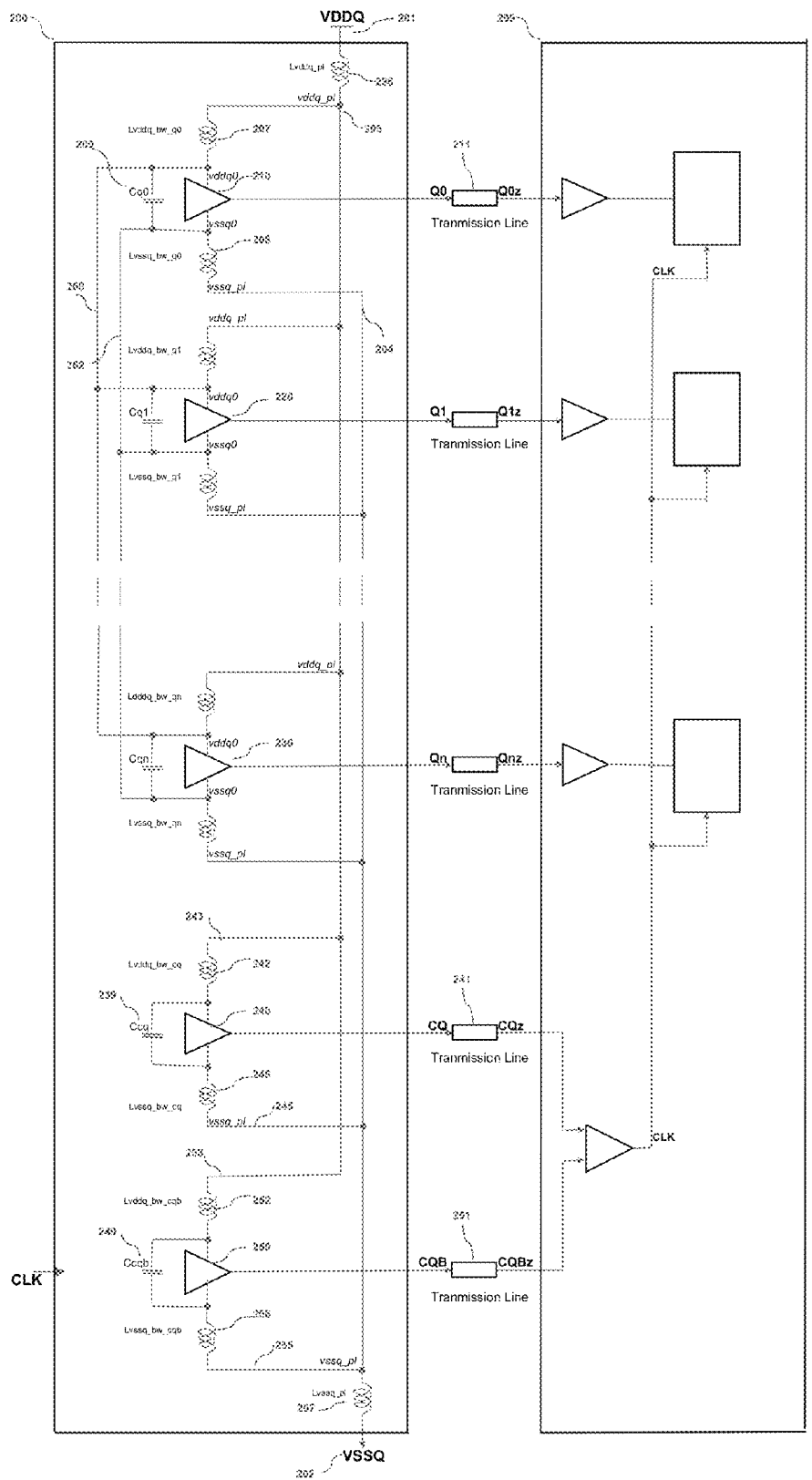
FIG. 2 is a block diagram of an exemplary device having dedicated data output and echo clock pads consistent with certain aspects related to the innovations herein.

FIG. 2 is a block diagram of an exemplary device having dedicated data output and echo clock pads consistent with certain aspects related to the innovations herein. Here, an illustrative diagram of dedicated power and ground pads for the echo clocks is shown, wherein each echo clock, CQ 240 and CQB 250, has its own power pads and ground pads. FIG. 2 also comprises a chip 200, such as an SRAM or DRAM, that drives another chip 299 via transmission lines such as representative lines 211, . . . , 241 and 251. In the illustrative chip shown, each echo clock output 240, 250 (CQ and CQB) has its own power and ground pads (i.e., CQ has its own power and ground pads and CQB has it's own power and ground pads), each data output (Q) has its own power and ground pads, and all power and ground pads of the data outputs are connected together. According to the illustrative SRAM or DRAM chip 100 of FIG. 2, the VDDQ 201 and VSSQ 202 planes of the package may all share power (VDDQ_PL 205) and ground (VSSQ_PL 204) through VDDQ power plane inductor Lvddq_pl 296 and VSSQ power plane inductor Lvssq_pl 297, respectively. With regard to the echo clock, CQ 240 may have its own VDDQ pad and bond wire inductor Lvddq_bw_cq 242, and VDDQ 243 may connect together with the VDDQ_PL lines of all other outputs to the VDDQ_PL 205. CQ 240 may also have its own VSSQ pad and bond wire inductor Lvssq_bw_cq 246, and VSSQ 245 may connect together with the VSSQ_PL lines of all other outputs to the VSSQ_PL 204. Similarly, echo clock CQB 250 may have its own VDDQ pad and bond wire inductor Lvddq_bw_cqb 252, and a VDDQ 253 that may connect together with the VDDQ lines of all other outputs to VDDQ_PL 205. Further, CQB 250 may have its own VSSQ pad and bond wire inductor Lvssq_bw_cqb 256, and a VSSQ 255 that connects together with the VSSQ lines of all other outputs to VSSQ_PL 204. Additionally, CQ 240 may have its own decoupling capacitor Ccq 239 and CQB 250 may have its own decoupling capacitor Ccqb 249.

Turning to the output (Q) circuitry, each power pad of each data output (Q) may be coupled to a common line 260 and each ground pad of each data output may be coupled together via a line 262, as well. Each data ouput (Q) may also have its own decoupling capacitor (e.g., Q0 210 has Cq0 209, Q1 has Cq1, . . . , Qn has Cqn). Moreover, each data output (Q0 210, Q1 220, . . . , and Qn 230) may have its own VDDQ and VSSQ bond wire inductors (e.g., Q0 210 having Lvddq_bw_q0 207 and Lvssq_bw_q0 208, etc).

Illustrated in FIGS. 2 and 7 are an interrelated block diagram and representative waveforms of dedicated power and ground pads for each echo clock (CQ or CQB). Consistent with such aspects of the innovations herein, each echo clock (CQ or CQB) may have its own power and ground pads. As such, during data output switching, the power and ground of the output echo clock pair is not affected by data output switching, therefore, each output echo clock (CQ or CQB) is not affected by DQs. However, each output echo clock may be affected by its own switching noise. As for location in the physical layout, CQB and its power and ground pads may, for example, be placed at top-left corner of the chip and CQ and its power and ground pads may be placed at top-right corner of the chip, as set forth in more detail below.

Figure 3:
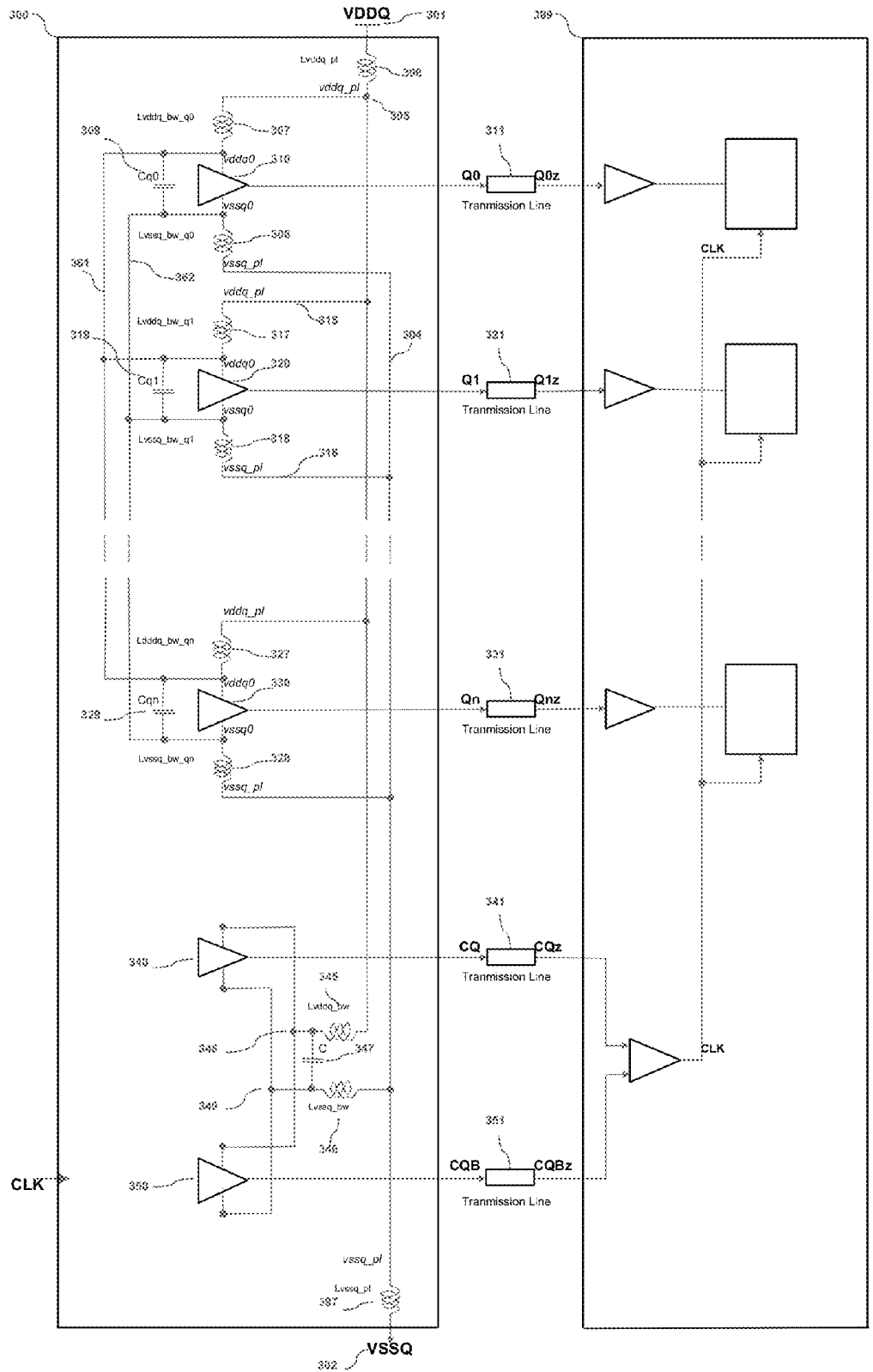
FIG. 3 is a block diagram of an exemplary device having dedicated data output and echo clock pads consistent with certain aspects related to the innovations herein.

FIG. 3 is a block diagram of another exemplary device having dedicated data output pads consistent with certain aspects related to the innovations herein. Here, an illustrative diagram of dedicated power and ground pads for the echo clocks is shown, wherein both echo clocks, CQ 340 and CQB 350, share power and ground pads. FIG. 3 comprises a chip 300, such as an SRAM or DRAM, that drives another chip 399 via transmission lines such as representative lines 311, 321, 331, 341 and 351 depicted in the drawing. In the illustrative chip shown, the echo clock output pair 340, 350 (CQ and CQB) share power and ground pads, each data output (Q) has its own power and ground pads, and all power and ground pads of the data outputs are connected together. According to the illustrative SRAM or DRAM chip 300 of FIG. 3, the VDDQ 301 and VSSQ 302 planes of the package may all share power (VDDQ_PL 305) and ground (VSSQ_PL 304) through VDDQ power plane inductor Lvddq_µl 396 and VSSQ power plane inductor Lvssq_µl 397, respectively. Further, the echo clock pair, CQ 340 and CQB 350, may share the same VDDQ pad 348 and VSSQ pad 349 and share VDDQ_PL 305 and VSSQ_PL 304 power through its own Lvddq_bw 345 and Lvssq_bw 346 bond-wired inductors. In addition, a decoupling capacitor 347 may also be provided between CQ 340 and CQB 350. Referring to FIG. 3, all of the data outputs (Q0 310, Q1 320, . . . , and Qn 330) may have their own power and ground connections, VDDQ0 361 and VSSQ0 362, and may also have capacitors (Cq0 309, Cq1 319, . . . , and Cqn 329) in parallel therebetween. Further, each data output may also have its own VDDQ and VSSQ bond wire inductors (e.g., Q0 310 has VDDQ Lvddq_bw_q0 inductor 307 and VSSQ Lvssq_bw_q0 inductor 308, Q1 320 has VDDQ Lvddq_bw_q1 inductor 317 and VSSQ Lvssq_bw_q1 inductor 318, . . . , and Qn 330 has VDDQ Lvddq_bw_qn inductor 327 and VSSQ Lvssq_bw_qn inductor 328).

Such configurations may be implemented to reduce the above-mentioned power and ground noise issues that may effect the output echo clock pair (CQ and CQB). Here, via inclusion of dedicated power and ground pads for CQ and for CQB of the clock echo output pair, such innovations may enable the echo clock to serve better as a differential output echo clock. Further, as explained elsewhere herein, the power and ground pads of the echo clock output (CQ and CQB) may be connected together with the power and ground pads of the data output (Q).

Accordingly, consistent with aspects of the innovations herein, power and ground pads may be dedicated to each echo clock element (CQ or CQB) or to both echo clock elements (CQ and CQB). Such features may enable the power and ground of output echo clock pair to suffer little or no variation during data output signal switching. As such, the output echo clock signal integrity is less affected during data output switching.

Further, in some exemplary implementations, to reduce the above-mentioned power and ground noise issues that may effects the output echo clock pair (CQ and CQB), the present innovations may involve dedicated power and ground pads for the clock echo output pair (CQ and CQB). As a function of features such as this, aspects of the present innovations may enable the echo clock to serve better as a differential output echo clock.

Figure 4:
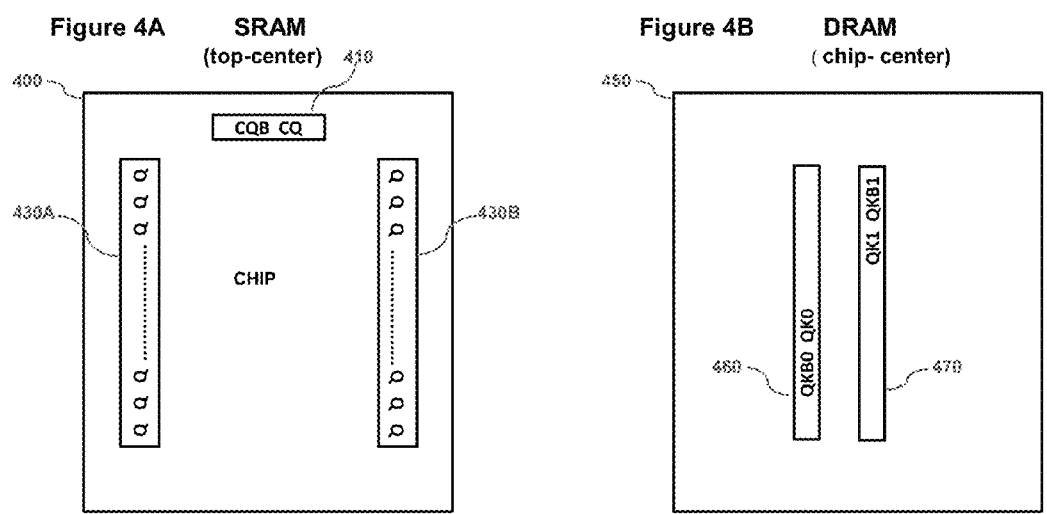
FIGS. 4A-4B are block diagrams of exemplary devices with differing chip layouts consistent with certain aspects related to the innovations herein.

FIGS. 4A-4B are block diagrams of exemplary devices with different chip layouts consistent with certain aspects related to the innovations herein. Referring to the drawings, FIG. 4A illustrates a block diagram of pad location of an echo clock pair and their power and ground pads at top-center of a physical layout of a chip (e.g., for SRAM), and FIG. 4B illustrates a block diagram of pad location of an echo clock pair and their power and ground pads and at chip-center (e.g., for DRAM).

The exemplary SRAM chip 400 shown in FIG. 4A illustrates data output pads (e.g., Q0, Q1, ..., Qn) and associated power and ground pads located on the left side 430A of the chip as well as other data output pads (e.g., Q0, Q1, ..., Qn) and their associated power and ground pads located on the right side 430B of the chip. Further, echo clock pads (CQ and CQB) as well as their dedicated power and ground pads may be located at a top, center region 410 of the chip 400.

The exemplary DRAM chip 450 shown in FIG. 4B illustrates output pads comprising all data output pads (Q0, Q1, ..., Qn) and echo clocks pads (CQ, CQB) along with their own power and ground pads located at center regions 460 and 470 of the chip 450.

Here, for example, such use and placement of dedicated power and ground pads for the clock echo output pair (CQ and CQB) enable aspects of reduced power and ground noise effecting the output echo clock pair, as explained herein. Further, as set forth in connection with FIGS. 3, 4 and 6, aspects of the present innovations may enable the echo clock to act as a differential output echo clock. To achieve this, for example, the output echo clock CQ and CQB are placed together as a pair to enable sharing of their VDDQ/VSSQ supplies and a decoupling capacitor, as shown, e.g., in FIG. 3. Further, such CQ/CQB pair may be placed at a top center region of the chip for SRAM implementations, and at a center region for DRAM implementations, as shown, e.g., FIG. 4. As a result, the power and ground noise of output echo clock pair (CQ and CQB) is significantly improved with regard to the SSO effects, as indicated in FIG. 6, for example.

Figure 5:
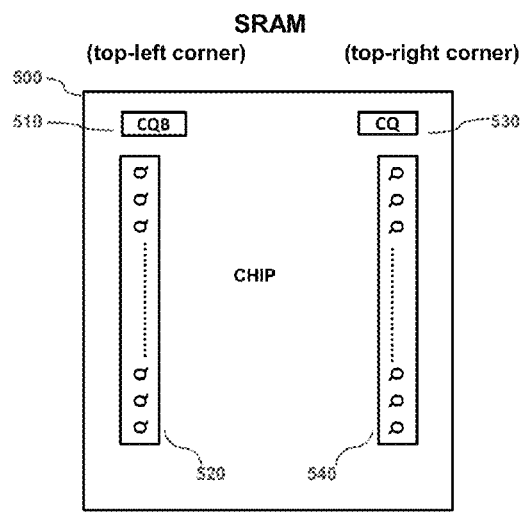
FIG. 5 is a block diagram of an exemplary device showing another chip layout consistent with certain aspects related to the innovations herein.

FIG. 5 is a block diagram of an exemplary device showing another chip layout consistent with certain aspects related to the innovations herein. Referring to FIG. 5, a illustrative diagram of pad locations of each echo clock and its power and ground pads, at two top corners of a physical layout of a chip, is shown. The exemplary SRAM chip 500 shown in FIG. 5 illustrates data output pads (e.g., Q0, Q1, ..., Qn) and associated power and ground pads located on the left side 520 of the chip as well as other data output pads (e.g., Q0, Q1, ..., Qn) and their associated power and ground pads located on the right side 540 of the chip. Further, the echo clock output CQB and its power and ground pads may be located at a top-left corner 510 of the chip 500, and the echo clock output CQ and its own power and ground pads may be located at top-right corner 530 of the chip 500.

FIG. 6 illustrates exemplary waveforms showing reference clock and echo clock regarding FIG. 3 for different conditions (top vs. bottom) consistent with certain aspects related to the innovations herein. Referring to FIG. 6, representative waveforms are shown, consistent with the dedicated power and ground pads for the output echo clock pair (CQ and CQB) of FIG. 3. Two waveforms are depicted, including a first case 610 regarding a solid data output, 7× vs. 1×[7 data output=high vs. 1 data output=low] reflecting waveforms for the data output (Qz's), CQz and CQBz. Also included is a second case 650 regarding an alternating data output, 4× vs. 4×[4 data output=high vs. 4 data output=low] again reflecting waveforms for Qz's, CQz and CQBz.

The waveforms illustrated in FIG. 6 show output effects consistent with the first case 610 (top graph) and the second case 650 (bottom graph). As seen with regard to the first case 610, the simultaneous switching output (SSO) effects have little impact on CQz 616 and CQBz 618 because CQz and CQBz have their own noise cancelation. However, Qz's such as (7 data output=high) 612 and (1 data output=low) 614 have their own noise. Consequently, CQz 616 and CQBz 618 are significantly improved from SSO effect. The CQz and CQBz pair is shown its own decoupling capacitor 347. During the CQz and CQBz switching, the decoupling capacitor 347 is simultaneously charging and discharging the vddq 348 and vssq 349 (vddq/vssq of CQ and CQB pair). The simultaneously charging and discharging action results to a noise cancelation of vddq 348 and vssq 349. Consequently, vddq 348 and vssq 349 are effectively quiet. The only minor noise effect to CQz 616 and CQBz 618 is from their own bond wires Lvddq_bw 345/Lvssq_bw 346 and the shared VDDQ_PL 305/VSSQ_PL 304 substrate planes with all data outputs (Q's). See, e.g., FIG. 3. Turning to the second case 650, there is no SSO effect for CQz 656 and CQBz 658 because CQz 656 and CQBz 658 have their own noise cancelation. In addition, output data switching Qz (4 data output=high) 652 and Qz (4 data output=low) 654 also have noise cancellation configurations. As such, all of CQz 656, CQBz 658, Qz 652 and Qz 654 are seen in the bottom graphs as having about the same characteristics.

FIG. 7 illustrates exemplary waveforms showing the reference clock and echo clock regarding FIG. 2 for different conditions (top vs. bottom) consistent with certain aspects related to the innovations herein. Referring to FIG. 7, exemplary waveforms are shown, consistent with the dedicated power and ground pads for the output echo clock pair (CQ and CQB) of FIG. 2. Two sets of waveforms are depicted, including a first case 710 (top graph) regarding a solid data output, 7× vs. 1×[7 data output=high vs. 1 data output=low] reflecting waveforms for the data output (Qz's), CQz and CQBz. Also included is a second case 750 (bottom graph) regarding an alternating data output, 4× vs. 4×[4 data output=high vs. 4 data output=low], again reflecting waveforms for Qz's, CQz and CQBz.

The waveforms illustrated in FIG. 7 show output effects consistent with the first case 710 (top graph) and the second case 750 (bottom graph). As seen with regard to the first case 710, the SSO effect due to Q output (7 data output=high) 712 has an impact on CQz 716 in that it switches in the same direction as Qz 712. On the other hand, CQBz 718 switches in an opposite direction of Qz 712, with little SSO effect, though it has its own noise. Further, another Qz output (1 data output=low) 714 has a direct SSO effect because all Qz 712 and Qz 714 share the same VDDQ/VSSQ buses. As such, CQBz 718 is improved with regard to the SSO effect, while CQz 716 is not. CQz 716 has almost the same amount of noise as that of Qz output (7 data output =high) 712 when switching in the same direction. This CQz 716 sum of noise is through the shared VDDQ_PL 205/VSSQ_PL 204 substrate planes with all data outputs (Q's) and its own bond wires Lvddq_bw_cq 242/Lvssq_bw_cq 246. In contrast, CQBz 718 has a net difference of noise through the shared VDDQ_PL 205/VSSQ_PL 204 substrate planes with all data outputs (Q's) and its own bond wires Lvddq_bw_cqb 252/Lvssq_bw_cqb 256 since CQBz 718 switches in opposite direction of Qz output (7 data output=high) 712. See, e.g., FIG. 2. Turning to the second case 750, there is no SSO effect for CQz 756 and CQBz 758 because of noise cancellation during output data switching of Qz (4data output=high) 652 and Qz (4 data output=low) 654. Here, as seen on the bottom of FIG. 7, CQz 756 and CQBz 758 (or Qz 752 and Qz 754) may have their own characteristics.

FIG. 8 illustrates further exemplary waveforms showing the reference clock and echo clock regarding FIG. 1 for different conditions (top vs. bottom). Referring to FIG. 8, exemplary waveforms are shown, consistent with the dedicated power and ground pads for the data outputs (Q's) and the output echo clock pair (CQ and CQB) of FIG. 1. Two waveforms are depicted, including a first case 810 regarding a solid data output, 7× vs. 1×[7 data output=high vs. 1 data output=low] reflecting waveforms for the data output (Q's), CQ and CQB. Also included is a second case 850 regarding an alternating data output, 4× vs. 4×[4 data output=high vs. 4 data output=low], again reflecting waveforms for Q's, CQ and CQB.

The waveforms illustrated in FIG. 8 show output effects consistent with the first case 810 (top graph) and the second case 850 (bottom graph). As seen with regard to the first case 810, the SSO effects here directly impact to all of CQz 816, CQBz 818, Qz 812 and Qz 814 due to Qz (7 data output=high) 812 and Qz (1 data output=low) 814 because all of CQz 816, CQBz 818, Qz 812 and Qz 814 are shared the same VDDQ 160/VSSQ 162 buses. The total noise induced at vddq 160/vssq 162 buses is a sum of noise through the shared VDDQ_PL 105/VSSQ_PL 104 substrate planes and through the shared VDDQ 160/VSSQ 162 buses. See, e.g., FIG. 1. Consequently, CQz 816 and CQBz 818 are directly affected via the SSO effects. Turning to the second case 850, there is no SSO effect to any of CQz 816, CQBz 818, Qz 812 and Qz 814 because of noise cancellation during output data switching via Qz (4data output=high) 852 and Qz (4 data output=low) 854. Here, as seen on the bottom of FIG. 8, all of CQz 856, CQBz 858, Qz 852 and Qz 854 may have the same characteristic(s).

FIG. 9 is a block diagram of a representative device showing pads as may be located on a chip consistent with certain aspects related to the innovations herein. Here, a block diagram of exemplary pad locations corresponding to various echo clock, data output, power and ground connections is shown. FIG. 9 depicts a representative SRAM chip 900 illustrating an implementation with blocks of outputs 910 where every data output has at least one power pad and at least one ground pad (see, e.g., 910A, 910C or 910D). Here, for example, as shown in one illustrative block 910A, a data output DQ 914 has one or more VSSQ 912 and one or more VDDQ 916 associated therewith. FIG. 9 also illustrates outputs for the echo clock pair (CQ 908 and CQB 902) including dedicated VDDQ pad 906 and VSSQ pad 904 associated therewith. It is noted that the pads illustrated, here (CQB 902, VSSQ 904, VDDQ 906 and CB 908) are illustrative, and may be arranged in different combinations and/or order. Further, to ensure that the outputs have similar delay, every data output (DQ) or echo clock (CQ or CQB) line may be arranged such that associated signals have similar delay lengths/times, such as total trace length in the substrate from the die pad. Here, for example, lines in the substrate, such as 920 and 922, from the die pad for CQ 908 to substrate BGA ball 930 and from the die pad for CQB 902 to substrate BGA ball 932 are designed such that they both have equivalent delay, whether such delay is configured via layout, e.g., by arrangement of appropriate/differing lengths or via other configuration(s) relating to other aspects of timing, such as different transmission paths, materials, propagation speeds, layers, etc.

Aspects of the present innovations may be further implemented by sharing power and ground pads for the output echo clock pair (CQ and CQB) as illustrated in FIGS. 3 and 6. In this preferred arrangement, the output echo clock pair (CQ and CQB) shares power and ground pads. During data output switching, the power and ground of output echo clock pair is not affected by data output switching. Furthermore, the decoupling capacitor shares between power and ground (VDDQ/VSSQ) of echo clock pair acts like a voltage source and prevents the switching noise introduced by output echo clock pair (CQ and CQB) through power and ground inductors. Consequently, power supply noise of differential output echo clock pair may be reduced, e.g., to much smaller levels. In accordance with such features, then, the output echo clock signal integrity is not degrading with data output switching.

FIG. 10 depicts an exemplary bonding diagram design associated with an illustrative SRAM circuit consistent with certain aspects related to the innovations herein. Referring to FIG. 10, a diagram illustrating part of a bonding diagram of an exemplary SRAM device is shown, including a substrate 1000 and a die 1010, wherein CQB pad 1011, VSSQ pad 1012, VDDQ pad 1013 and CQ pad 1014, all are located at top-center region of the chip. Here, for example, the VSSQ pad 1012 and VDDQ pad 1013 may be dedicated pads associated with the echo clock CQB pad 1011 and the CQ pad 1014. Further, each of these pads may have its own bond wire connecting it to it's own associated bond pad on the substrate, for example, CQB 1011 may have a bond wire connecting it to a CQB bond pad 1015, VSSQ 1012 may have a bond wire connecting it to a VSSQ bond pad 1016, VDDQ 1013 may have a bond wire connecting it to a VDDQ bond pad 1017, and CQ 1014 may have a bond wire connecting it to a CQ bond pad 1018. As for data output, a data output pad QC(0) 1019 may have its own bond wire connecting it to an associated bond pad 1021. Further, the data output pad QD(1) 1020 has its own bond wire connects to bond pad 1022. These bond pads may be connected to substrate layer, such as metal layer CU1, as set forth for example in FIG. 11.

FIG. 11 depicts an exemplary upper metal layer substrate design associated with an illustrative SRAM circuit consistent with certain aspects related to the innovations herein. FIG. 12 depicts an exemplary lower metal layer substrate design associated with an illustrative SRAM circuit consistent with certain aspects related to the innovations herein. Here, in some illustrative implementations, traces for every signal may routed in both layers of substrate, for example, in upper and lower metal layers such as copper1 and copper 4 (CU1 and CU4). As such, as shown FIG. 11 and also in FIG. 12, CU1 trace (trace on layer 1) and CU4 trace (trace on layer 4) may be different in length on each layer. Some traces are configured in a zigzag manner, curved, or routed in other non-linear physical layout arrangements on purpose. By means of such routing, however, according to some implementations, the sum of the CU1 trace length and the CU4 trace length plus the bond wire length of every data output (Q) may be fabricated as equivalent.

Referring to FIG. 11, an exemplary portion of an upper metal layer (e.g., CU1) of a substrate 1100 is shown, consistent with aspects of the innovations herein. Such CU1 layer, here, may be the top layer of substrate design including bond pads, which are connected to the die via bond wires. In this CU1 layer, the echo clock signal CQB is shown routed from CQB bond pad to CQB in CU1 via trace 1111, and the echo clock signal CQ is shown routed from CQ bond pad to CQ in CU1 via trace 1112. With respect to the data outputs, a first data output signal QC(0) may be routed from the QC(0) bond pad to QC(0) in CU1 via trace 1113, and a second data output signal QD(1) may be routed from QD(1) bond pad to QD(1) in CU1 via trace 1114.

Referring to FIG. 12, an exemplary portion of a lower metal layer (e.g., CU4) of a substrate 1200 is shown, consistent with aspects of the innovations herein. Such CU4 layer, here, may be the bottom layer which contacted with BGA balls. By way of illustration and not limitation, this exemplary layer is directed to a 165 Ball Grid Array (BGA) pin out which is a JDEC standard pin out with 11 columns by 15 rows, e.g., with columns labeled numerically and rows labeled alphabetically. In such 165 BGA pin out, or 11×15 matrix, ball location A1 is CQB ball 1210 and located at top-left corner, ball location A11 is CQ ball 1220 and located on top-right corner. With regard to data output (Q's), one or more may be located on a few columns on the left side and one or more may be located on a few columns on the right side, in the view of FIG. 12. In this illustrative design, the QC(0) ball may be assigned to ball B2 1230 and QD(1) may be assigned to ball C2 1240. In this CU4 layer, a signal to be connected to BGA balls may be continued/routed by a CU4 trace through its own via that connects to its own GU1 trace. In this design, for example, the echo clock signal CQB is continued/routed by its CU4 trace 1211 and then connects to CQB BGA ball 1210, CQ is continued/routed by its CU4 trace 1221 and then connects to CQ BGA ball 1220, QC(0) is continued/routed by its CU4 trace 1231 and then connects to QC(0) BGA ball 1230, and QD(1) is continued/routed by its CU4 trace 1241 and then connects to CQB BGA ball 1240, and so on.

FIGS. 13A, 13B and 13C are illustrations of chip layout designs of exemplary SRAM chips and circuitry consistent with certain aspects related to the innovations herein. FIG. 13A illustrates a whole chip image of an exemplary SRAM layout design showing the VDDQ and VSSQ pads of echo clock CQ and CQB at a top, center region 1302, and the VDDQ and VSSQ pads of the data output (Q's) at a left region 1304. FIG. 13B illustrates a close up image of an exemplary SRAM layout design, highlighting the VDDQ layout of the echo clock CQ and CQB and the VDDQ layout of the data output (Q's). FIG. 13C illustrates a similar close up mage, highlighting the VSSQ layout of the echo clock CQ and CQB and the VSSQ layout of the data output (Q's).

Referring to FIG. 13A, a chip layout 1300 is shown, illustrating the whole chip with regions directed to various data output VDDQ/VSSQ layout aspects and various echo clock VDDQ/VSSQ layout aspects. Here, for example, the echo clock is located at the top, center region 1302 of the chip, while the data output(s) may be located at left side (e.g. 1304) and the right side (e.g., 1306) of the chip. Additionally, it should be noted that power and ground buses of left side (e.g. 1304) may or may not be connected to power and ground buses of right side (e.g. 1306). Further, it should be noted that while certain regions are emphasized in this and the following figures for data output QC(0), such as the left side as discussed herein, this precise location and layout of the data output is provided for purpose of illustration, i.e., without limitation on the innovations herein unless specifically recited.

Referring to FIG. 13B, an upper portion of the chip layout 1300 of FIG. 13A is shown, including data output VDDQ and echo clock VDDQ regions highlighted (1305b and 1305a, respectively), wherein CQB pad 1311, VSSQ pad 1312, VDDQ pad 1313 and CQ pad 1314, all are located at top-center region of the chip. The VSSQ pad 1312 and VDDQ pad 1313 illustrated, here, may be dedicated power and ground buses for output echo clock drivers of CQB pad 1311 and CQ pad 1314. In contrast, data output driver QC(0) pad 1319 may have separated power and ground buses associated with VDDQ pad 1320 and VSSQ pad 1318.

Referring to FIG. 13C, a similar upper portion of the chip layout 1300 of FIG. 13A is shown, including data output VSSQ and echo clock VSSQ regions highlighted (1305d and 1305c, respectively), wherein CQB pad 1311, VSSQ pad 1312, VDDQ pad 1313 and CQ pad 1314, all are located at top-center region of the chip. The VSSQ pad 1312 and VDDQ pad 1313 illustrated, here, may be dedicated power and ground buses for output echo clock drivers of CQB pad 1311 and CQ pad 1314. In contrast, data output driver QC(0) pad 1319 may have separated power and ground buses associated with VDDQ pad 1320 and VSSQ pad 1318.

In addition to the exemplary configurations above, the innovations herein may be achieved via implementations with differing circuitry, layouts and/or components, beyond the specific examples set forth above. With regard to such other implementations (e.g., layouts, circuitry, components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to, various clock- or timing-related circuitry, such as that within personal computers, servers or server computing devices such as routing/connectivity components, handheld or laptop devices, multiprocessor systems, microprocessor-based systems, set top boxes, smart phones, consumer electronic devices, network PCs, other existing computer platforms, distributed computing environments that include one or more of the above systems or devices, etc.

In some instances, aspects of the innovations herein may be achieved via logic and/or logic instructions including program modules, executed in association with the circuitry, for example. In general, program modules may include routines, programs, objects, components, data structures, etc. that performs particular tasks or implement particular control, delay or instructions. The inventions may also be practiced in the context of distributed circuit settings where circuitry is connected via communication buses, circuitry or links. In distributed settings, control/instructions may occur from both local and remote computer storage media including memory storage devices.

Innovative circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules or other data embodying the functionality herein. Further, communication media may include wired media such as a wired network or direct-wired connection, and wireless media such as acoustic, RF, infrared and other wireless media. Combinations of the any of the above are also included within the scope of computer readable media.

In the present description, the terms component, module, device, etc. may refer to any type of logical or functional circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, implementations and features consistent with the present inventions may be implemented through computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe components such as software, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various processes and operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, and so on).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list. Further, as used in context in the claims below, "dedicated" pads refer to pads that are isolated as against the other power pad(s).

As set forth above, aspects of the present innovations relate to features of dedicated power and ground pads for an output echo clock pair and/or decoupling capacitance for power and ground of echo clock and data output, among other inventions. Such features may, for example, prevent the power and ground noises that stem from data output switching and/or otherwise degrade the output echo clock pair signal integrity.

It should be understood that the inventions described herein are provided by way of example only and that other features, advantages, and objects consistent with the present innovations will become apparent by reference to the following specification and drawings in combination with the knowledge of one of ordinary skill in the art regarding such systems and methods.

The invention claimed is:
1. A semiconductor memory device comprising:
   echo clock circuitry including at least one data output circuit and an echo clock output pair (CQ and CQB), wherein the echo clock circuitry is configured to provide an echo clock signal as a function of a reference clock signal;
   first power and ground pads for the echo clock outputs, the power pads being dedicated, wherein the power pads for the echo clock outputs CQ and CQB are connected, and ground pads for the echo clock outputs CQ and CQB are connected;

second power and ground pads for data output circuits, wherein the data output power pads are connected together and the data output ground pads are connected together;

wherein buses associated with each of the first power and ground pads are separate/distinct from respective buses of the second power and ground supply pads/buses.

2. The device of claim 1 wherein the ground pads of the echo clock are also dedicated.

3. The device of claim 1 further comprising a decoupling capacitor coupled between the power and the ground (shared VSSQ/VDDQ) of each of the echo clock pairs.

4. The invention of claim 1 further comprising a chip containing the echo clock circuitry and the pads, wherein the echo clock pair(s), CQ, CQB, and the power pads and ground pads connected therebetween are located in a top, center region of the chip.

5. The invention of claim 1 further comprising a chip containing the echo clock circuitry and the pads, wherein the echo clock pair(s), CQ, CQB, the interconnected power pads associated therewith, and the interconnected ground pads associated therewith are located in a center region of the chip.

6. The invention of claim 1, further comprising a chip containing the echo clock circuitry and the pads and in which positions of the echo clock pads are physically located, wherein a first echo clock as well as the power pad(s) and the ground pad(s) associated with the first echo clock are positioned at a corner of a top side of the chip in physical layout, wherein the CQB, the CQB power pad(s) and the CQB ground pad(s) are located at a top left corner of the chip, and wherein the CQ, the CQ power pad(s) and the CQ ground pad(s) are located at a top right corner of the chip.

7. The invention of claim 1 wherein the CQB, the CQ, the VDDQ and/or the VSSQ pads are positioned in any order in their physical layout.

8. The invention of claim 1 wherein the CQB, the CQ, the VDDQ and/or the VSSQ pads are positioned in order, of their physical layout, as described or shown via drawings herein.

9. The invention of claim 1 further comprising one or more power (VDDQ) and ground (VSSQ) pairs for each of the data outputs.

10. The invention of claim 1 further comprising one or more data output for every power pad, and one or more data output for every ground pad.

11. The invention of claim 1 wherein the output echo clock (CQ and CQB) paths are configured such that total lengths or transmission lengths from their respective die-pad locations in the physical layout to a ball grid array ("BGA") of the package are about equal.

12. The invention of claim 11 wherein lengths of CQ and CQB lines can be different than length(s) of the data output (Q).

13. The invention of claim 11 wherein lengths of CQ and CQB lines can equal length(s) of the data output (Q).

14. The invention of claim 1 wherein data output (Q's) paths are configured such that total lengths or transmission lengths from their respective die-pad locations in the physical layout to a ball grid array ("BGA") of the package are about equal.

15. The invention of claim 1 wherein the echo clock (CQ or CQB) are configured with time delay amounts that are about equal.

16. The invention of claim 1 wherein the data output circuits (Q's) are configured with delay amounts that are about equal.

17. A semiconductor memory device comprising:
echo clock circuitry including at least one data output circuit and an echo clock output pair (CQ and CQB), wherein the echo clock circuitry is configured to provide an echo clock signal as a function of a reference clock signal;
first power and ground pads for the echo clock outputs, at least the first power pads being dedicated, wherein the power pads and the ground pads for the echo clock output CQ are separate from respective power pads and ground pads of the echo clock output CQB; and
second power and ground pads for data output circuits, wherein the data output power pads are connected together and the data output ground pads are connected together;
wherein the first power and ground pads/buses are separate/distinct from the second power and ground supply pads/buses.

18. The device of claim 17 wherein the ground pads of the echo clock are also dedicated.

19. The device of claim 17 further comprising a decoupling capacitor coupled between the power and the ground (shared VSSQ/VDDQ) of at least one of the echo clock outputs.

20. A method of fabricating a semiconductor memory device, comprising:
forming echo clock circuitry including at least one data output circuit and an echo clock output pair (CQ and CQB), wherein the echo clock circuitry is configured to provide an echo clock signal as a function of a reference clock signal;
providing first power and ground pads for the echo clock outputs, the power and/or ground pads being dedicated, wherein the power pads for the echo clock outputs CQ and CQB are connected, and ground pads for the echo clock outputs CQ and CQB are connected;
providing second power and ground pads for data output circuits, wherein the data output power pads are connected together and the data output ground pads are connected together;
wherein buses associated with each of the first power and ground pads are separate/distinct from respective buses of the second power and ground supply pads/buses.

* * * * *